United States Patent
Yoo et al.

Patent Number: 6,033,969
Date of Patent: Mar. 7, 2000

[54] METHOD OF FORMING A SHALLOW TRENCH ISOLATION THAT HAS ROUNDED AND PROTECTED CORNERS

[75] Inventors: Chue-San Yoo; R. Y. Lee; J. H. Tsai, all of Hsin-Chu, Taiwan

[73] Assignee: Taiwan Semiconductor Manufacturing Co., Ltd., Hsin-Chu, Taiwan

[21] Appl. No.: 08/721,758

[22] Filed: Sep. 30, 1996

[51] Int. Cl.$^7$ ................................................. H01L 21/76

[52] U.S. Cl. ................. 438/425; 438/426; 438/424; 438/443

[58] Field of Search ................... 438/424, 425, 438/426, 435, 437, 443

[56] References Cited

U.S. PATENT DOCUMENTS 5,350,941  9/1994  Madan ..................................... 257/647

*Primary Examiner*—Trung Dang
*Attorney, Agent, or Firm*—Tung & Associates

[57] ABSTRACT

A method is provided for forming a shallow trench isolation that has rounded and protected corners by first forming a bird's beak field oxide layer prior to the trench-forming step such that a rounded and protected top corner and a rounded bottom corner of the trench can be formed. The rounded top and bottom corners of the shallow trench opening have a radius of at least 100 Å and a trench depth of not more than 5000 Å. The top corner of the trench opening is protected by the beak portion of the bird's beak against etching in a subsequent oxide dip process before gate formation.

10 Claims, 1 Drawing Sheet

METHOD OF FORMING A SHALLOW TRENCH ISOLATION THAT HAS ROUNDED AND PROTECTED CORNERS

FIELD OF THE INVENTION

The present invention generally relates to a method of forming shallow trench isolation in a semiconductor device and more particularly, relates to a method of forming shallow trench isolation that has rounded and protected corners in a semiconductor substrate.

BACKGROUND OF THE INVENTION

In the more recently developed semiconductor technology, shallow trench isolations have been used in high density memory and other semiconductor devices since the isolation provides simplified back-end operations such as packaging. This is in contrast to a bird's beak type LOCOS isolation which provides an uneven top surface (or topography) on a memory device and leads to poor photolithographic results due to focusing difficulties. Shallow trench isolation can be etched in the silicon between neighboring devices. It allows a device to be built closer together.

When a shallow trench isolation is used in a semiconductor device, a more planar surface on the device can be obtained due to the absence of formation of bird's beak. Based on the advantages of a tighter line definition and a greater planarity that are achieved by the shallow trench isolation, the isolation is very suitable for applications in sub-half-micron semiconductor processes.

Isolation of individual semiconductor devices without using the bird's beak can be carried out by etching shallow vertical trenches in the silicon between neighboring devices. In shallow trench isolation, trenches of about 0.3 to 0.8 micron deep are anisotropically etched into a silicon substrate by a dry etching technique. The active regions in a substrate are protected from the etch during the trench etching step. After the trenches are formed, a chemical vapor deposition oxide is deposited on the wafer surface and then etched back so that the oxide only remains in the trenches having its top surface at the same level as the original silicon surface. The etch back process is frequently performed by using a sacrificial photoresist method. This processing technique has the advantages of not requiring any bird's beak and that no encroachment is involved. When two devices on a substrate are separated by a trench, the electrical field lines have to travel a longer distance and change directions twice, so that the field lines are considerably weakened. Shallow trenches of submicron dimensions are therefore adequate for isolation to prevent the punch-through and latch-up phenomena.

The drawbacks of a shallow trench isolation is its more complicated process and the sharp corners formed both at the top and at the bottom of the trench. This is shown in FIG. 1 where a shallow trench 10 is formed in silicon substrate 12 having a sharp top corner and a sharp bottom corner 16. In a shallow trench isolation, it is difficult to obtain round corners at the bottom of a trench, and even more difficult to have a round corner uniformly across a wafer. The sharp corners 16, shown in FIG. 1, could produce dislocations in the crystal lattice and also current leakage. The top corner 14 of the trench also need to be rounded in order to avoid leakage current. The sharp corners can cause field crowding and gate oxide thinning problems which result in a double hump behavior in a current/voltage relationship. The gate oxide thinning problem can cause a thinner layer of oxide being grown at the corner location. During a subsequent thermal cycle, junction leakage can occur. An over-etch 22 can occur at the interface where the oxide meets the silicon substrate surface. This is shown in FIG. 2. The exposed sharp corner 14 shown in FIG. 1 will further enhance the gate oxide thinning problem. It is therefore desirable to provide a method of preventing the occurrence of over-etch.

It is therefore an object of the present invention to provide a method of forming shallow trench isolation with rounded and protected corners without the drawbacks or shortcomings of the conventional shallow trench process.

It is another object of the present invention to provide a method of forming shallow trench isolation that produces trenches that have rounded and protected corners such that field crowding and gate oxide thinning problems do not occur.

It is a further object of the present invention to provide a method of forming shallow trench isolation with rounded and protected corners such that dislocation does not occur at the bottom corner of the trench.

It is another further object of the present invention to provide a method of forming shallow trench isolation that has rounded and protected corners by a chemical vapor deposition technique for depositing oxide into the trench.

It is still another object of the present invention to provide a method of forming shallow trench isolation that has rounded and protected corners by first depositing a layer of pad oxide and then a layer of silicon nitride on the silicon substrate as a masking layer.

It is yet another object of the present invention to provide a method of forming shallow trench isolation that has rounded and protected corners by first forming a bird's beak field oxide under a nitride mask and then etching away the main body of the field oxide.

It is still another further object of the present invention to provide a method of forming shallow trench isolation that has rounded and protected corners by rounding the top corners of the trench with the beak portion of a bird's beak field oxide layer.

It is yet another further object of the present invention to provide a method of forming shallow trench isolation that has rounded and protected corners by a technique of anisotropically etching silicon substrate to a depth of less than 5000 Å through a nitride mask.

SUMMARY OF THE INVENTION

The present invention provides a method of forming shallow trench isolation with rounded and protected corners by first providing a silicon substrate, then forming a layer of pad oxide on the substrate, then forming a layer of silicon nitride on the pad oxide, then forming an opening through the layers of the pad oxide and the silicon nitride and exposing a first area of the silicon substrate, then forming a bird's beak field oxide layer in the first area of silicon substrate which has a center portion having a thickness between about 500 Å and about 1500 Å and a substantially tapered edge portion, then anisotropically etch the center portion of the field oxide layer that is not covered by the silicon nitride layer to expose a second area of the silicon substrate, then anisotropically etch the silicon substrate in the exposed second area to a depth of not more than 5000 Å to form a shallow trench that has rounded top and bottom corners wherein the substantially tapered edge portion of the field oxide layer protects the top corners of the trench from being etched, and filling the shallow trench with silicon oxide.

The present invention is also directed to a shallow trench isolation formed in a semiconductor device that includes a silicon substrate, a layer of pad oxide on the silicon substrate, a layer of silicon nitride on the pad oxide, an opening formed through the layers of the pad oxide and the silicon nitride exposing a first cavity, a bird's beak field oxide layer formed in the first cavity which has its center portion that is not covered by the silicon nitride layer removed and a substantially tapered edge portion retained under the silicon nitride layer, a trench opening that is etched in the silicon substrate in an area not covered by the substantially tapered edge portion of the field oxide layer wherein the trench has substantially rounded top and bottom corners and a depth which is sufficient for the trench to function as an electrical isolation, and silicon oxide which fills the trench opening. The shallow trench isolation may also include a lining oxide layer on the inner sidewall of the trench opening between the silicon oxide and the silicon substrate. The substantially rounded top and bottom corners in the shallow trench opening generally have a radius of at least 100 Å, while the trench opening generally has a depth of not more than 5000 Å.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

In accordance with the present invention, a method for forming shallow trench isolation that has rounded and protected corners by first forming a bird's beak field oxide layer prior to the formation of the trench is provided.

In the method, a silicon substrate is first provided. A layer of pad oxide is then formed on the substrate, a layer of silicon nitride for use as both a dielectric layer and a masking layer is then deposited on top of the oxide layer. An opening is then formed through the layers of the pad oxide and the silicon nitride to expose an area of the silicon substrate. A bird's beak field oxide layer is then formed in the exposed area of the silicon substrate to produce a field oxide layer that has a center portion of a thickness between about 500 Å and about 1500 Å and a substantially tapered edge section. The center portion of the field oxide layer that is not covered by the silicon nitride masking layer is then anisotropically etched away by either a wet dip or a dry etch method to expose a second area of silicon substrate. The second area of the silicon substrate is then anisotropically etched away to a depth of not more than 5000 Å to form a shallow trench that has rounded top and bottom corners. The substantially tapered edge portion of the field oxide layer protects the top corners of the trench from being etched during the process. The shallow trench is then filled with silicon oxide by a chemical vapor deposition technique.

Figure 3:
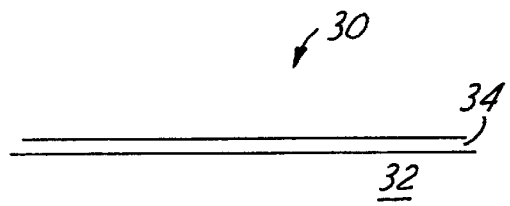
FIG. 3 is an enlarged, cross-sectional view of a present invention silicon substrate coated with a pad oxide layer.
Figure 4:
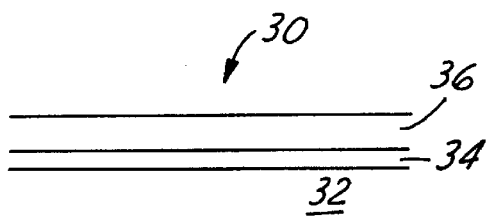
FIG. 4 is an enlarged, cross-sectional view of the present invention silicon substrate coated with a pad oxide and a silicon nitride layer.

Referring initially to FIG. 3, where a semiconductor device 30 of a silicon substrate 32 having a thin layer of pad oxide 34 formed on top is shown. The pad oxide layer 34 is used as a lubricating layer to relieve stress between a silicon nitride layer which is subsequently deposited and the silicon substrate. It usually formed by a thermal oxidation technique to a thickness of approximately 100 Å~200 Å. In the next step of the process, a silicon nitride layer 36 is deposited on top of the pad oxide layer 34 on the semiconductor device 30 as shown in FIG. 4. The deposition of silicon nitride is carried out by a chemical vapor deposition technique or any other suitable deposition methods. The thickness of the nitride layer deposited is between about 1500 Å and about 2500 Å. It should be noted that the silicon nitride layer 36 is being used not only as a dielectric layer, but also as a photomasking layer for the subsequent etching processes for the field oxide and the silicon substrate.

Figure 1:
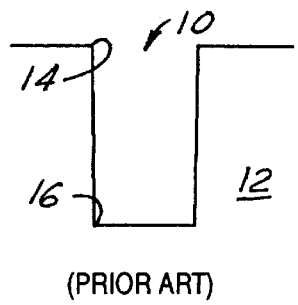
FIG. 1 is an enlarged, cross-sectional view of a conventional shallow trench opening that has sharp corners in a silicon substrate.
Figure 5:
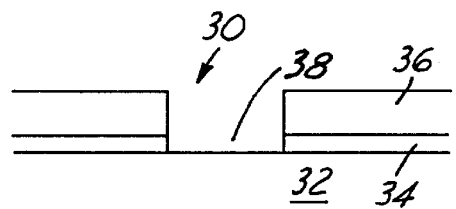
FIG. 5 is an enlarged, cross-sectional view of that shown in FIG. 4 but having a window opened to expose the silicon substrate.
Figure 2:
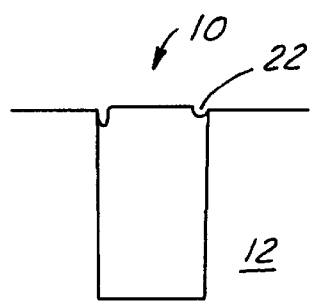
FIG. 2 is an enlarged, cross-sectional view of a conventional shallow trench opening in a silico substrate that is filled with an oxide and is over-etched at the top corners of the trench.

The silicon nitride layer 36 is then patterned by a conventional photolithographic method by using a photoresist layerto open a window 38 in the semiconductor device 30. A suitable photoresist layer used is I-line or deep-UV resist. This is shown in FIG. 5. In the next step of the process, the semiconductor device 30 is placed in an oven at a temperature of at least 900° C. for a time period of at least 30 minutes such that a bird's beak field oxide layer 42 is grown in the surface of the silicon substrate 32.

Figure 6:
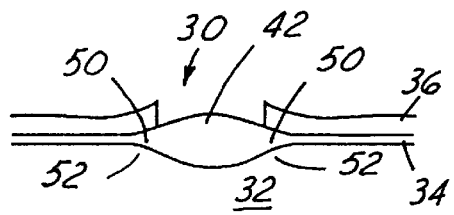
FIG. 6 is an enlarged, cross-sectional view of that shown in FIG. 5 but having a bird's beak field oxide layer grown in the opening.

As shown in FIG. 6, the bird's beak field oxide layer 42 is grown not only in the vertical direction but also in the lateral direction forming beak 50. The size of the beak formed and the thickness of the field oxide can be suitably controlled by the temperature and the exposure time. For the purpose of the present invention, it should be noted that a relatively small bird's beak field oxide layer is required, i.e., the center portion of the field oxide layer is approximately between about 500 Å and about 1500 Å thick which tapers down to a thickness of approximately 100 Å~500 Å at the beak section. Since the bird's beak filled oxide layer 42 is only used as a sacrificial layer for protecting the top corner 52 of the trench to be formed, and to allow the formation of a rounded corner at the top of the trench opening, only a small bird's beak field oxide layer is required.

In the next step of the process, the silicon nitride layer 36 is used as a masking layer for etching away the field oxide 42 that is not covered by the nitride layer. The etching process can be conducted by either a wet etch or a dry etch process. A dry etch process of plasma anisotropic etch is more preferred since the process can be easily controlled and the bird's beak section 50 can be protected due to the anisotropic nature of the etch. A suitable plasma etch process utilizes $CF_4/Ar$ as the etchant gas at a power of 1000~1500 W and a chamber pressure of 200~500 m Torr. If a wet etch process is used, the bird's beak section 50 may be etched away and therefore the top corner sidewall in the trench opening can not be protected in a final etch process of the silicon substrate.

Figure 7:
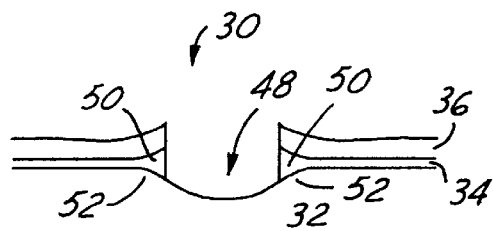
FIG. 7 is an enlarged, cross-sectional view of that shown in FIG. 6 with the field oxide layer not covered by the silicon nitride mask etched away.

As shown in FIG. 7, an opening 48 is formed after the field oxide layer 42 (FIG. 6) is etched away. It should be noted that since the beak section 50 is protected by the nitride layer 36 during the anisotropic dry etch process, it is left intact after etching to protect the top corner 52 of the trench opening to be formed in a subsequent processing step.

Figure 8:
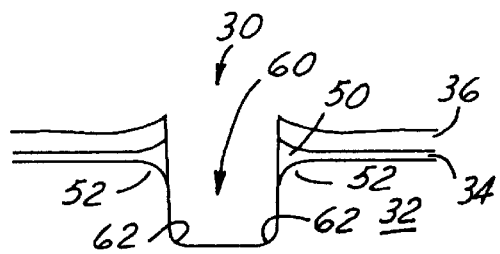
FIG. 8 is an enlarged, cross-sectional view of that shown in FIG. 7 after the silicon substrate is etched away in an anisotropic etch process.

In the final processing step for forming the trench opening 60, as shown in FIG. 8, an anisotropic etch process of the silicon is used to form a trench opening having a depth between about 3500 Å and about 5000 Å. A suitable etchant gas used in the anisotropic etch is high HBr/low $Cl_2$/He—$O_2$. A trench depth of not more than 5000 Å is therefore formed by the anisotropic etching process which again utilizes the nitride layer 36 as a masking layer. Rounded corner 62 at the bottom of the trench opening 60 is obtained after the anisotropic etching process in the silicon substrate. The desirable rounded corner 62 protects the trench opening from crystal dislocation in the silicon and possible junction leakage problems which would otherwise occur in a sharp corner. The top corner 52, shown in FIG. 8, is also protected and rounded by the bird's beak 50 such that gate oxide thinning and field crowding problems can be avoided.

After the trench opening 60 is formed, other conventional processing steps may be carried out to fill the trench opening 60 with a dielectric material such as silicon oxide. For instance, a wet dip process can be first used to remove the nitride layer and the underlaying pad oxide layer. A sacrificial oxide layer is then grown to improve the surface characteristics for the growth of a subsequent gate oxide layer. The sacrificial oxide layer can be removed by a wet dip process utilizing HF acid before the formation of the gate oxide. The density of the gate oxide can also be improved by an annealing process. It should be noted that prior to the filling of the trench with silicon oxide by a chemical vapor deposition process, a thin lining oxide layer can be first grown on the sidewall of the trench opening to guarantee the Si/$SiO_2$ interface quality. In a final step of the process, a chemical mechanically polishing technique can be used to planarize the top of the device.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of forming a shallow trench isolation that has rounded and protected corners comprising the steps of:
   providing a silicon substrate,
   forming a layer of silicon nitride on said substrate,
   forming an opening through said layer of silicon nitride and exposing a first area of said silicon substrate,
   forming a bird's beak field oxide layer in said first area of silicon substrate having a center portion having a thickness of at least about 500 Å and a substantially tapered edge portion,
   anisotropically etching said center portion of the field oxide layer not covered by said silicon nitride layer without using oxide sidewall spacers exposing a second area of said silicon substrate,
   anisotropically etching said silicon substrate in said exposed second area to a depth of not more than 5000 Å forming a shallow trench having rounded top and bottom corners, said substantially tapered edge portion of said field oxide layer protects said top corner of the trench from being etched, and
   filling said shallow trench with silicon oxide.

2. A method according to claim 1, wherein said rounded top and bottom corners in said shallow trench have a radius of at least 100 Å.

3. A method according to claim 1, wherein the opening through said layer of silicon nitride is formed by a wet etch or dry etch method.

4. A method according to claim 1, wherein said bird's beak field oxide layer is formed by exposing the silicon substrate to a temperature of not less than 900° C. and for a time period of not less than 30 minutes.

5. A method according to claim 1, where said substantially tapered edge portion having a thickness of no less than 500 Å at its thickest cross-section.

6. A method according to claim 1, wherein said anisotropic etching step for said center portion of the field oxide layer is conducted by a plasma enhanced etch method.

7. A method according to claim 6, wherein said anisotropic etching is conducted by an etchant gas of HBr/$Cl_2$/He-$0_2$.

8. A method according to claim 1 further comprising the step of forming a lining oxide layer on the sidewall of the shallow trench prior to filling the trench with silicon oxide.

9. A method according to claim 1, wherein said shallow trench is filled with silicon oxide by a chemical vapor deposition technique.

10. A method according to claim 1 further comprising the step of forming a paid oxide layer on said substrate prior to forming said nitride layer, and forming an opening through said layers of pad oxide and silicon nitride to expose a first area of said silicon substrate.

* * * * *